(12) United States Patent
Shrivastava

(10) Patent No.: US 11,393,923 B2
(45) Date of Patent: Jul. 19, 2022

(54) DRAIN EXTENDED TUNNEL FIELD EFFECT TRANSISTOR

(71) Applicant: Indian Institute of Science, Karnataka (IN)

(72) Inventor: Mayank Shrivastava, Bangalore (IN)

(73) Assignee: Indian Institute of Science, Bangalore (IN)

( * ) Notice: Subject to any disclaimer, the term of this patent is extended or adjusted under 35 U.S.C. 154(b) by 121 days.

(21) Appl. No.: 15/439,951

(22) Filed: Feb. 23, 2017

(65) Prior Publication Data
US 2021/0119044 A1 Apr. 22, 2021

(30) Foreign Application Priority Data
Feb. 25, 2016 (IN) .............................. 201641006497

(51) Int. Cl.
*H01L 29/78* (2006.01)
*H01L 29/06* (2006.01)
*H01L 27/092* (2006.01)

(52) U.S. Cl.
CPC ........ *H01L 29/7835* (2013.01); *H01L 27/092* (2013.01); *H01L 29/0665* (2013.01); *H01L 29/7848* (2013.01)

(58) Field of Classification Search
CPC ............... H01L 27/092; H01L 29/0665; H01L 29/0843; H01L 29/41725; H01L 29/66356; H01L 29/7391; H01L 29/7835; H01L 29/7848; H01L 29/78618; H01L 29/78624
See application file for complete search history.

(56) References Cited

U.S. PATENT DOCUMENTS

| 9,123,804 | B2 * | 9/2015 | Ren | H01L 29/66681 |
| 9,577,079 | B2 * | 2/2017 | Gossner | H01L 29/78621 |
| 2011/0303950 | A1 * | 12/2011 | Lauer | H01L 29/165 257/192 |
| 2014/0048765 | A1 * | 2/2014 | Ma | H01L 29/66356 257/12 |
| 2014/0291736 | A1 * | 10/2014 | Goto | H01L 29/7391 257/288 |

* cited by examiner

Primary Examiner — David C Spalla
(74) Attorney, Agent, or Firm — Inskeep IP Group, Inc.

(57) ABSTRACT

A Drain Extended Tunnel FET (DeTFET) device is disclosed that outperforms state of art devices and can meet the requirements of High voltage/high power devices operating in the range of 5V-20V for System on Chip (SoC). The device comprises a P+ SiGe source with an N-type Si Epilayer sandwiched between SiGe source and the gate stack, which enables vertical tunneling of minority carriers from SiGe P+ source into N-Epi region under the influence of gate field. The area tunneling between SiGe source and Si Epi region breaks the barrier imposed by thermionic injection based carrier transport from source to channel, which exists in DeMOS devices known in the art. The disclosed device results in improved performance in respect of ON current, leakage, sub-threshold slope, breakdown voltage and RF characteristics making it attractive for SoC applications as compared to its state of the art counterparts.

18 Claims, 11 Drawing Sheets

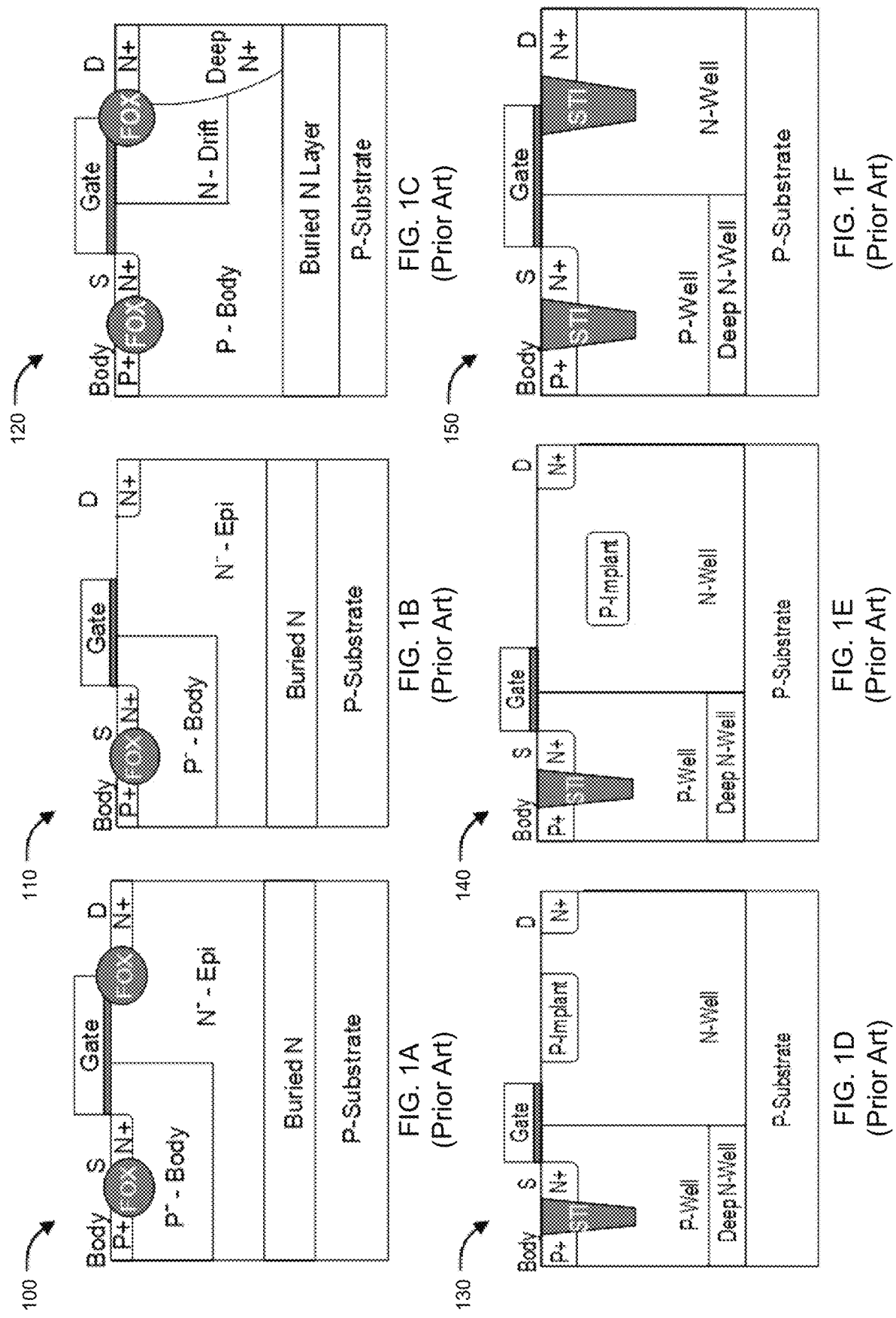

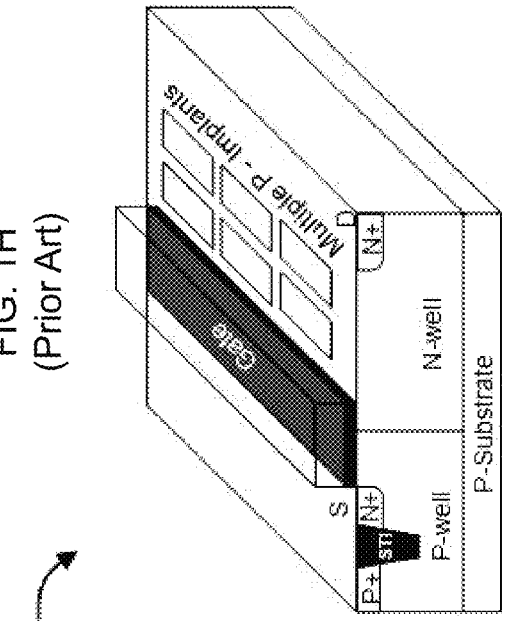
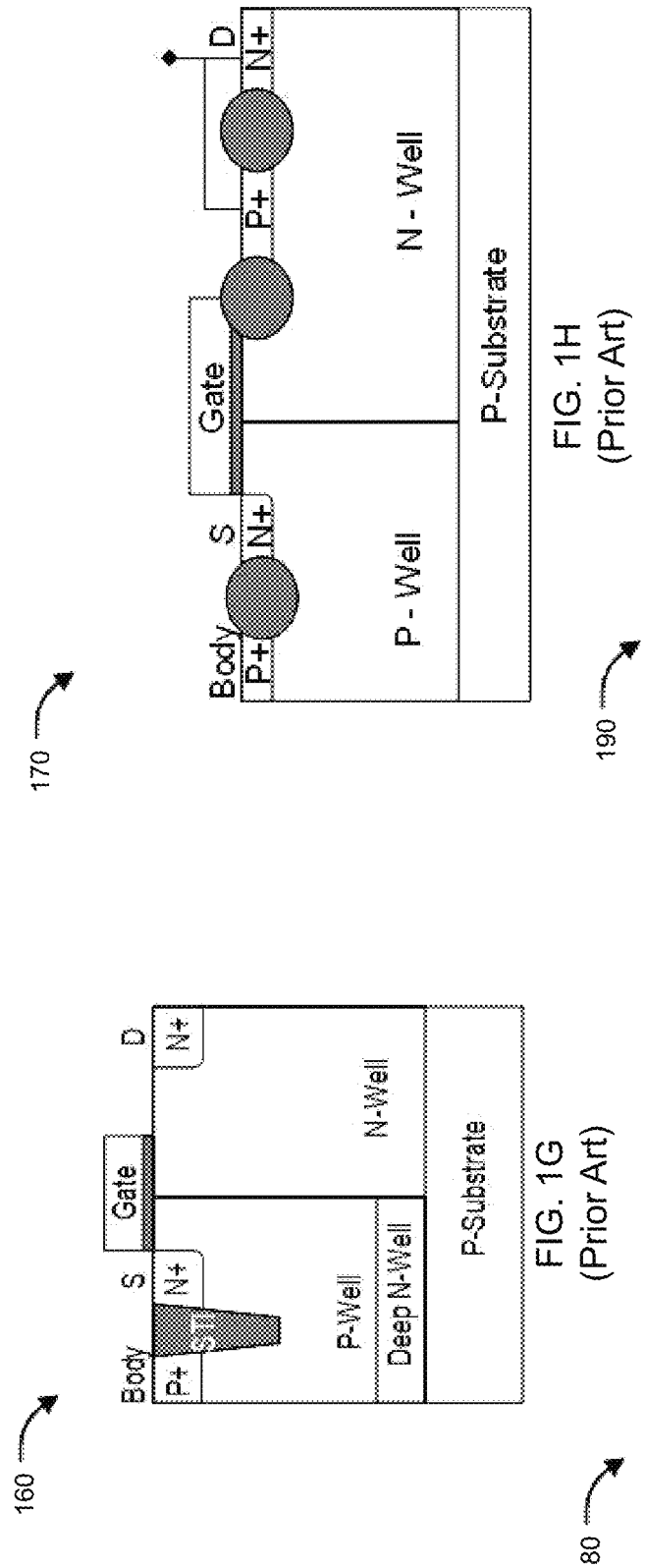
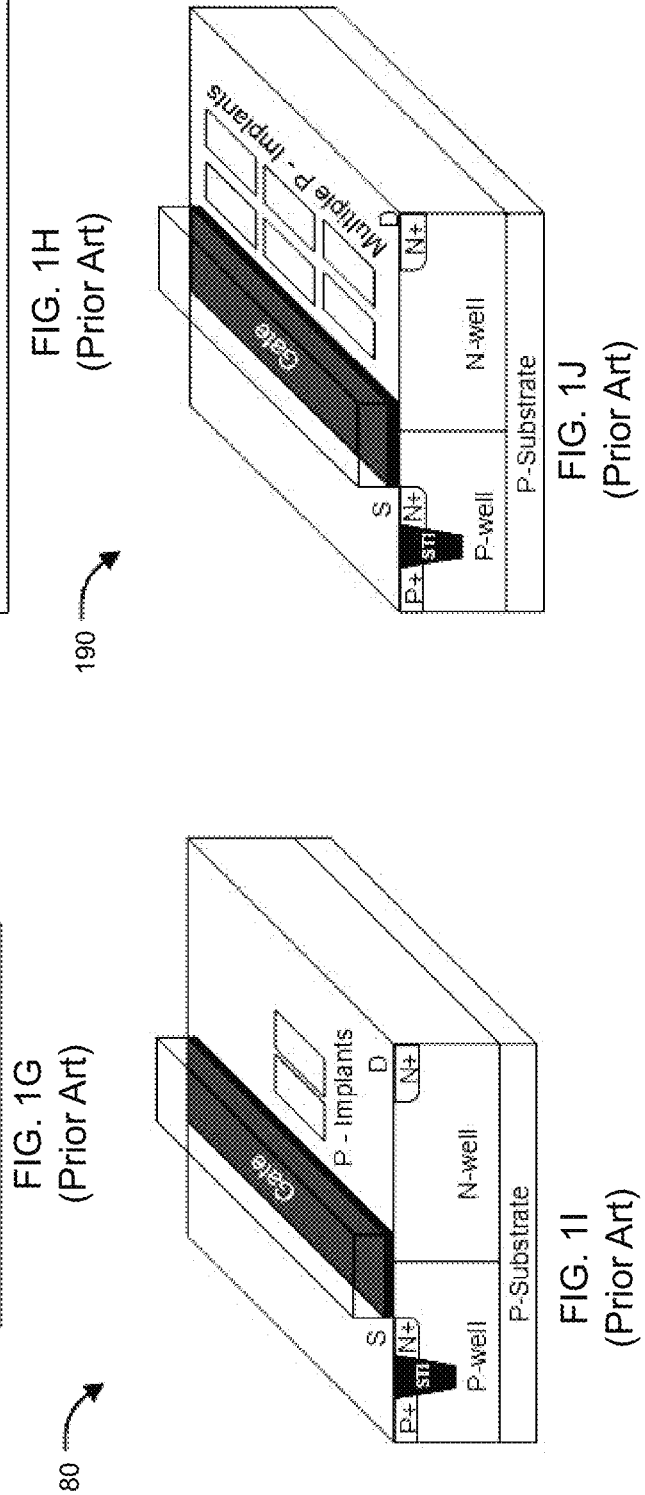
FIG. 1H (Prior Art)
FIG. 1J (Prior Art)
FIG. 1G (Prior Art)
FIG. 1I (Prior Art)

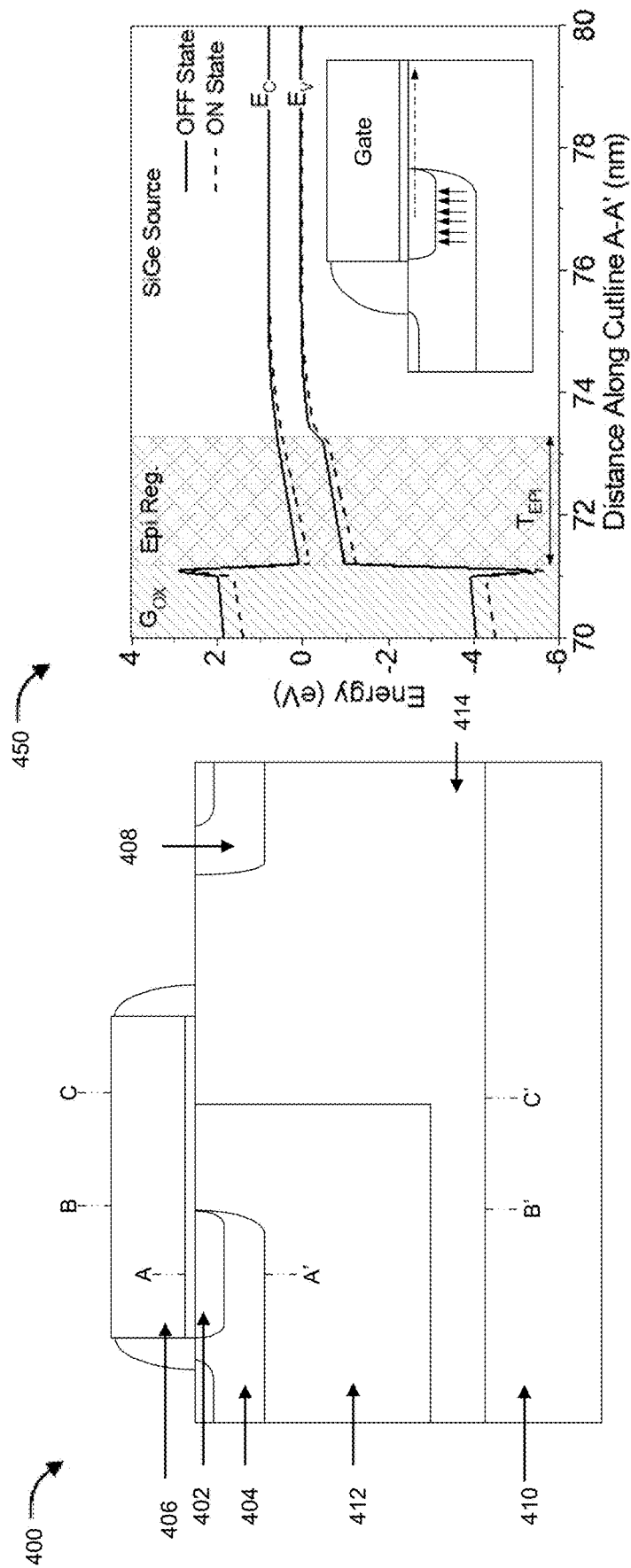

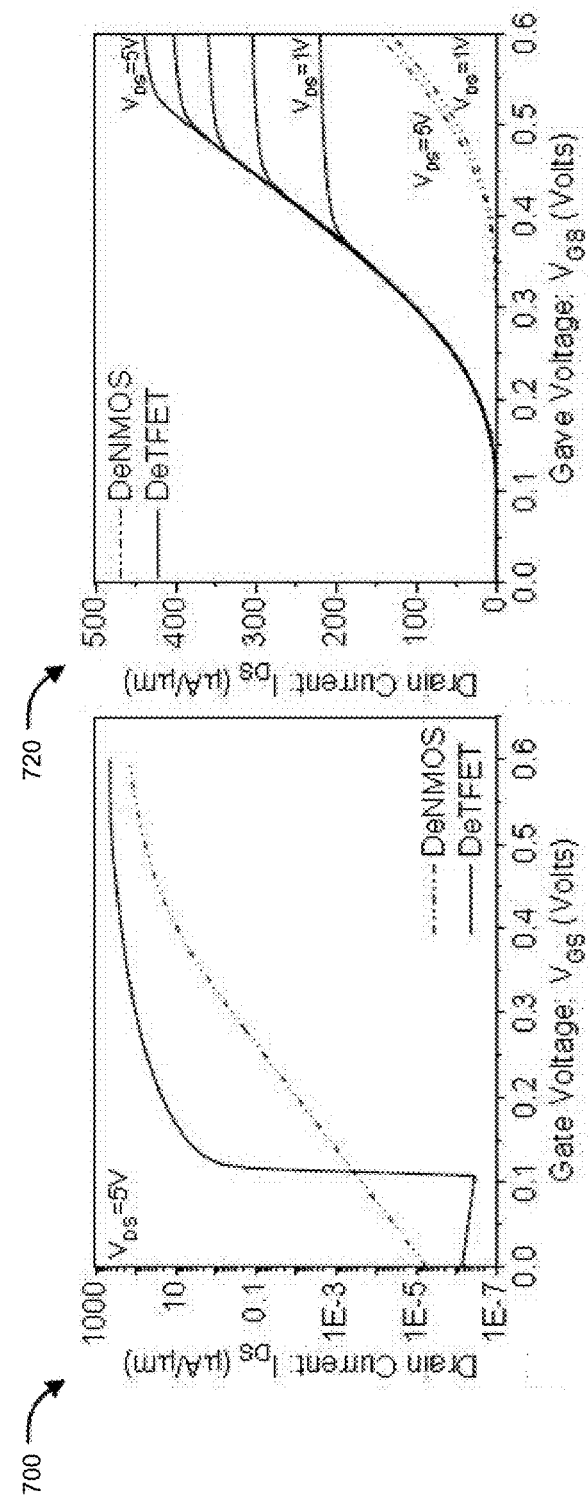
FIG. 7A
FIG. 7B
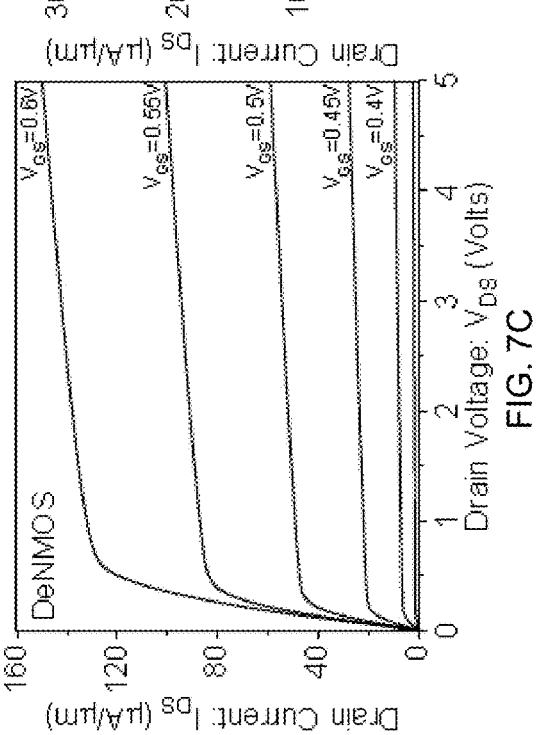
FIG. 7C
FIG. 7D

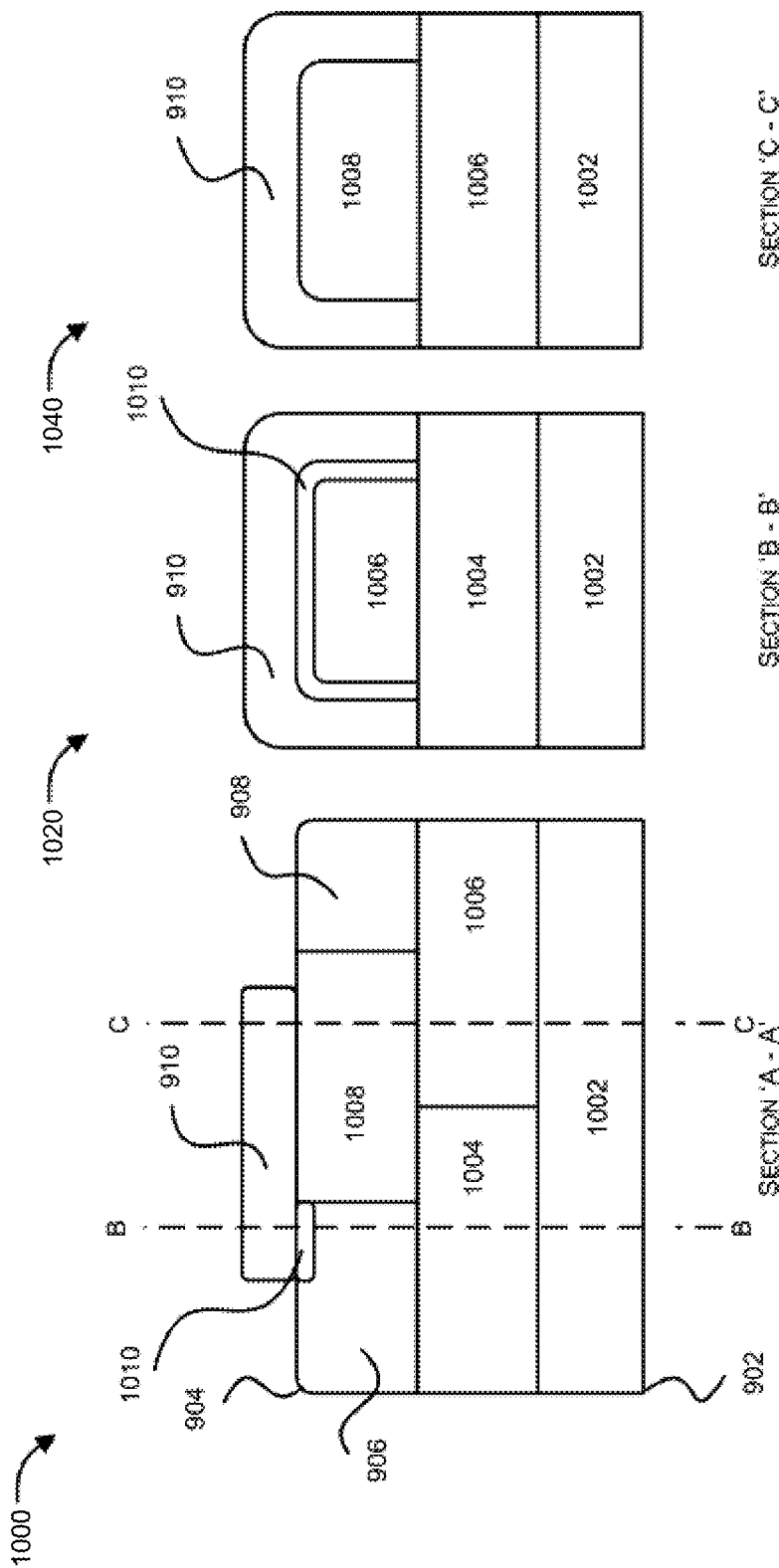

DRAIN EXTENDED TUNNEL FIELD EFFECT TRANSISTOR

RELATED APPLICATIONS

This application claims priority to Indian Patent Application No. 201641006497 filed Feb. 25, 2016, which is incorporated herein by reference in its entirety.

TECHNICAL FIELD

The present disclosure relates to the field of semiconductor devices and nanotechnology. In particular, the present disclosure pertains to a Drain Extended Tunnel FET (DeTFET).

BACKGROUND

Background description includes information that may be useful in understanding the present invention. It is not an admission that any of the information provided herein is prior art or relevant to the presently claimed invention, or that any publication specifically or implicitly referenced is prior art.

Nano electronic devices are generally fabricated on semiconductor substrates as integrated circuits. A complementary metal-oxide-semiconductor (CMOS) Field Effect Transistor (FET) is one of the core elements of an integrated circuit. Dimensions and operating voltages of CMOS transistors are continuously reduced, or scaled down, to obtain ever-higher performance and packaging density of the integrated circuits.

Problem of increasing power consumption as CMOS transistors are scaled down has been addressed by Fin Field Effect Transistors (FinFET) where conducting channel is wrapped by a thin silicon "fin" that forms the body of the device. However, FinFET technology has been predicted to become obsolete beyond 7 nm technology node, if not earlier, and is potentially expected to be replaced by Tunnel FETs. Though Tunnel FET technology has shown a great potential to outperform FinFETs, it is yet to see the required industrial maturity for commercialization. However, as there is no other technology option present, Tunnel FETs have acquired presence in the technology roadmap and is expected to be seen in semiconductor products after the year 2022.

High voltage/high power devices operating in the range of 5V-20V have become an essential need for System on Chip (SoC) designs. However, SoC design in FinFET and beyond FinFET nodes is an open question. Besides technological challenges, design rule limitations and lack of advance ESD protection concepts; absence of ultra-high voltage (UHV) device concept for 5V-20V operations is the key limiter. Also, SoC design requires integration of logic, analog, RF and high voltage functionalities on the same chip. This mandates processing of core, analog, RF and high voltage/high power devices in the same flow. The other emerging application of tunnel FET like low power technology is Internet of Things, which requires integration of SoC and sensors. In planar CMOS, LDMOS or Drain extended MOS (DeMOS) devices are used for UHV applications, which cater to on-chip functionalities like high voltage level shifters, line drivers, USB, RF power amplifier, charge pump camera flash and DC-DC convertor. Some such lateral power MOSFETs as known in the art are (a) LDMOS, (b) LDMOS without Field Oxide isolation, (c) LDMOS with deep drain, (d) Drain extended MOS, (e) non-STI Drain extended MOS, (f) LDMOS with embedded SCR, (g-h) non-STI DeMOS with P-island(s) in the drift region, (i j) non-STI DeMOS with local P-island(s) in the drift region and are illustrated in FIG. 1A to FIG. 1J respectively.

Similar power MOSFETs but with vertical schemes as known in the art are illustrated in FIG. 2A to FIG. 2D where (a) VDMOS, (b) D-MOSFET, (c) U-MOSFET and (d) Super Junction MOSFET are shown respectively.

Requirement of LDMOS or DeMOS like UHV devices in FinFET configuration has been addressed up-to a certain extent. However, no such solutions have been proposed for Tunnel FET technology, which, as stated above, is going to replace FinFET technology beyond 7 nm technology node. Envisioning such a scenario, there is requirement of a drain extended high voltage/high power device for tunnel FET technologies.

All publications herein are incorporated by reference to the same extent as if each individual publication or patent application were specifically and individually indicated to be incorporated by reference. Where a definition or use of a term in an incorporated reference is inconsistent or contrary to the definition of that term provided herein, the definition of that term provided herein applies and the definition of that term in the reference does not apply.

In some embodiments, numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the invention are approximations, the numerical values set forth in the specific examples are reported as precisely as practicable. The numerical values presented in some embodiments of the invention may contain certain errors necessarily resulting from the standard deviation found in their respective testing measurements.

As used in the description herein and throughout the claims that follow, the meaning of "a," "an," and "the" includes plural reference unless the context clearly dictates otherwise. Also, as used in the description herein, the meaning of "in" includes "in" and "on" unless the context clearly dictates otherwise.

The recitation of ranges of values herein is merely intended to serve as a shorthand method of referring individually to each separate value falling within the range. Unless otherwise indicated herein, each individual value is incorporated into the specification as if it were individually recited herein. All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the invention and does not pose a limitation on the scope of the invention otherwise claimed. No language in the specification should be construed as indicating any non-claimed element essential to the practice of the invention.

Groupings of alternative elements or embodiments of the invention disclosed herein are not to be construed as limitations. Each group member can be referred to and claimed individually or in any combination with other members of the group or other elements found herein. One or more members of a group can be included in, or deleted from, a group for reasons of convenience and/or patentability. When any such inclusion or deletion occurs, the specification is herein deemed to contain the group as modified thus fulfilling the written description used in the appended claims.

OBJECTS OF THE INVENTION

An object of the present disclosure is to provide a high power/high voltage device concept for 5V to 20V operations in System on Chip (SoC) designs.

Another object of the present disclosure is to provide a drain extended high voltage/high power device design for tunnel FET technologies.

Another object of the present disclosure is to provide a device design that incorporates vertical (area scaled) band-to-band tunneling of carriers from source to channel unlike thermionic injection of carriers in the prior art devices.

Yet another object of the present disclosure is to provide device design that has higher ON current, lower OFF current (leakage), lower threshold voltage, steep sub-threshold slope, higher break down voltage with lower ON resistance, lower sub-threshold leakage, absence of channel length modulation, drain induced barrier lowering, and improved RF characteristics as compared to state of art drain extended MOS/LDMOS devices.

Another object of the present disclosure is to provide Drain extended tunnel FET device (DeTFET) that has significantly better ON resistance for a range of gate voltages, higher trans conductance, and orders of magnitude higher intrinsic transistor gain when compared with counterpart/prior art designs.

Still another object of the present disclosure is to provide a device that has better scalability compared to state of art drain extended MOS/LDMOS devices.

SUMMARY

Aspects of the present disclosure relate to Field Effect Transistor (FET) design concept—a Drain Extended Tunnel FET (DeTFET) design concept to be specific that out performs state of art devices and can meet the requirements of high voltage/high power devices operating in the range of 5V-20V for System on Chip (SoC).

In an aspect, the proposed DeTFET device includes a drain region, a source region, and a channel region that is disposed between the source and the drain regions. The proposed DeTFET device further comprises a gate stack over the three regions. In an aspect, the source side region of the proposed device comprises P+ SiGe source with an N-type Si Epitaxial (Epi) region (or layer)(also interchangeably referred to as N-Epi layer) sandwiched between SiGe source and the gate stack to enable vertical or area tunneling of minority carriers from SiGe P+ source into N-Epi region under the influence of gate field.

In an aspect, the proposed DeTFET device comprises a P-Well region (or simply P-Well) of first conductivity type, and a N-well region (or simply N-Well) of second conductivity type next to each other to form a junction that is disposed vertically over a substrate. The DeTFET device further includes a source region (also referred to as source and the two terms used interchangeably) of the first conductivity type that is partially disposed inside the P-Well region, and a drain region (also referred to as drain and the two terms used interchangeably) of the second conductivity type that is partially disposed inside the N-Well, wherein the device further comprises an epitaxial layer of the second conductivity type. The proposed DeTFET device further comprises a gate stack that is disposed over the epitaxial layer, the P-well, and partially over the N-well.

In an aspect, the N-type Si Epi region sandwiched between SiGe source and the gate stack can enable vertical or area tunneling of minority carriers from SiGe P+ source into N-Epi region under the influence of gate field. The mobile carriers after tunneling from source to the epitaxial region are drifted from epitaxial region to the N-Well. In an aspect, area tunneling between the SiGe source and the N-type Si Epi region breaks the barrier imposed by thermionic injection based carrier transport from source to channel, which exists in DeMOS devices known in the art.

In an aspect, under OFF state, conduction band of N-type Si Epi region is not aligned with the valance band of SiGe P+ source, restricting quantum mechanical tunneling from valance to conduction band. However, when ON, the alignment takes place under influence of the gate field, which enables vertical tunneling.

In an aspect, the disclosed design concept can result in improved performance in respect of ON current, leakage, sub-threshold slope, breakdown voltage, and RF characteristics, making the proposed device more attractive for SoC applications as compared to its state of the art counterparts.

In an aspect, the disclosed DeTFET device does not show threshold voltage shift as a function of drain voltage. Therefore, there is no drain induced barrier lowering (DIBL) in the disclosed DeTFET device, which exists in DeMOS devices known in the art. This can help scaling the channel length further.

In an aspect, output characteristics of DeTFET in the saturation region are almost flat unlike DeMOS device, which shows absence of channel length modulation in the proposed device. This is attributed to tunneling nature of current injection, which makes the carrier injection from source to drain almost independent of drain field.

In an aspect, the disclosed DeTFET device has higher output current swing in for smaller range of input/gate voltage as compared to DeMOS device. In an aspect, the disclosed device offers better scalability as compared to the DeMOS device. Furthermore, the proposed concept can be adopted by the discrete power MOSFET technologies as well.

In an aspect, the proposed DeTFET device can be a fin structure based DeTFET device, which can enhance performance as the fin structure can result in further increase in area of the tunneling or alternatively can help in scaling down the size without compromising the performance.

Various objects, features, aspects and advantages of the inventive subject matter will become more apparent from the following detailed description of preferred embodiments, along with the accompanying drawing figures in which like numerals represent like components.

BRIEF DESCRIPTION OF THE DRAWINGS

The accompanying drawings are included to provide a further understanding of the present disclosure, and are incorporated in and constitute a part of this specification. The description, serve to explain the principles of the present disclosure.

FIGS. 1A to 1J illustrate few exemplary lateral power MOSFETs as known in the art.

FIG. 4A illustrates an exemplary schematic view of the disclosed Drain extended Tunnel FET in accordance with embodiments of the present disclosure.

FIG. 4B illustrates valance band energies vs. distance along the section 'A-A' of FIG. 4A under ON and OFF states of the disclosed DeTFET device in accordance with embodiments of the present disclosure.

FIGS. 7A-7D illustrate comparison of $I_D$-$V_G$ and $I_D$-$V_D$ characteristics of the disclosed DeTFET device vis a vis state of art DeMOS device in accordance with embodiments of the present disclosure.

FIG. 10A to FIG. 10C illustrate exemplary cross sectional details of the fin based DeTFET device of FIG. 10 in accordance with embodiments of the present disclosure.

DETAILED DESCRIPTION

Figures 2A, 2B, 2C, 2D:
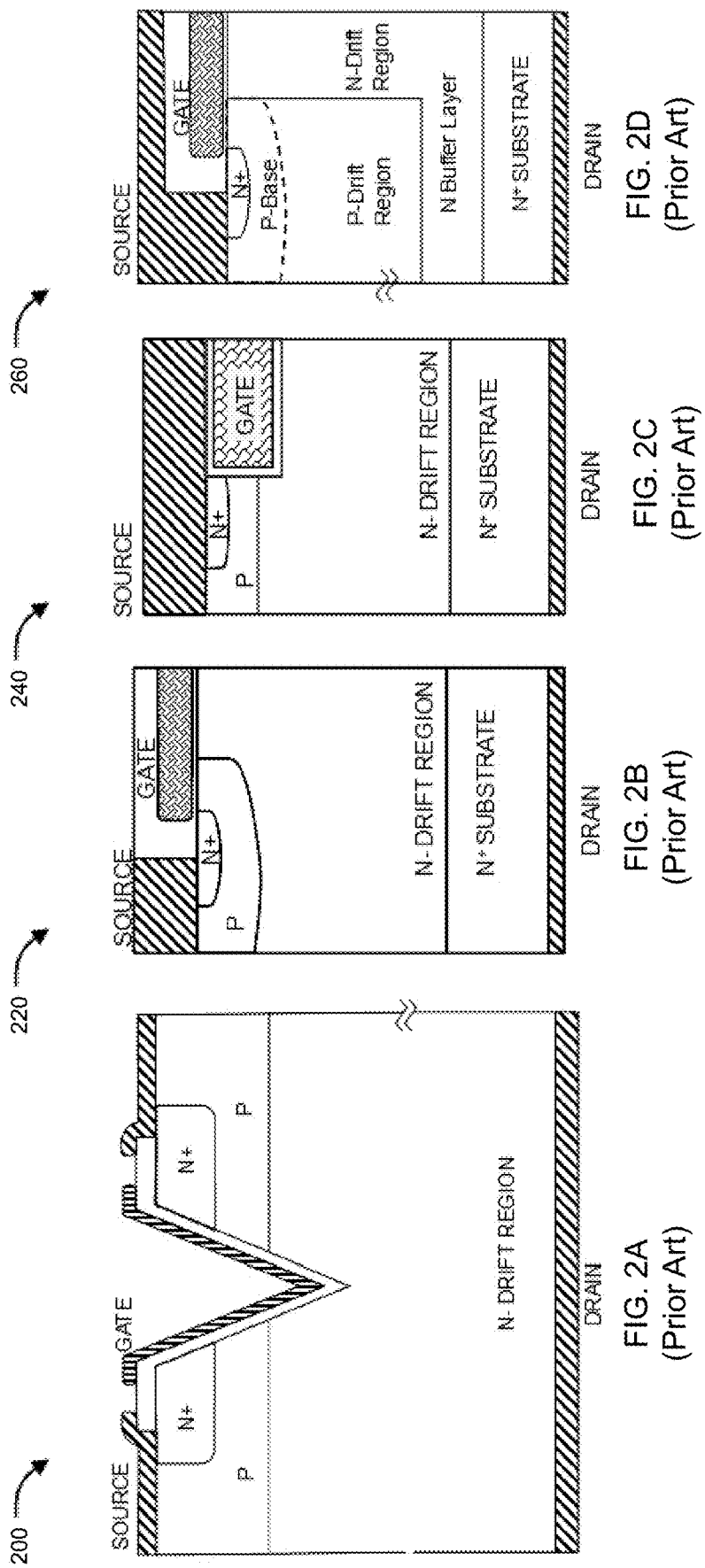
FIGS. 2A to 2D illustrate few exemplary power MOSFETs with vertical schemes as known in the art.

The following is a detailed description of embodiments of the disclosure depicted in the accompanying drawings. The embodiments are in such detail as to clearly the anticipated variations of embodiments; on the contrary, the intention is to cover all modifications, equivalents, and alternatives falling within the spirit and scope of the present disclosure as defined by the appended claims.

Each of the appended claims defines a separate invention, which for infringement purposes is recognized as including equivalents to the various elements or limitations specified in the claims. Depending on the context, all references below to the "invention" may in some cases refer to certain specific embodiments only. In other cases it will be recognized that references to the "invention" will refer to subject matter recited in one or more, but not necessarily all, of the claims.

Various terms as used herein are shown below. To the extent a term used in a claim is not defined below, it should be given the broadest definition persons in the pertinent art have given that term as reflected in printed publications and issued patents at the time of filing.

The present disclosure relates to a Drain Extended Tunnel FET (DeTFET) design concept that out-performs state of art FET devices, and can meet the essential requirements of high voltage/high power devices operating in the range of 5V-20V for System on Chip (SoC) designs and addresses requirement of beyond FinFET SOC applications.

In an aspect, the disclosed design concept utilizes band-to-band tunneling of carriers from source to channel which, compared to thermionic injection in DeMOS devices, results in several advantages such as higher ON current, lower leakage with lower threshold voltage, steep sub-threshold slope, higher breakdown voltage with lower ON resistance, and improved RF characteristics; making the proposed device more attractive for SoC applications when compared to its state of the art counterpart. In an aspect, the present disclosure provides a field effect transistor device comprising a source region of first conductivity type, a drain region of second conductivity type, an epitaxial layer of the second conductivity type that is partially disposed over the source region; and a gate stack that is disposed over the epitaxial layer, wherein gate field of the gate stack enables vertical tunneling of carriers from the source region to the epitaxial layer.

In an aspect, the proposed device can further include a P-Well region of the first conductivity type, and an N-well region of the second conductivity type configured next to each other to form a junction over a substrate. In another aspect, the source region is partially disposed inside the P-Well region, and the drain region is partially disposed inside the N-Well region. In yet another aspect, the P-Well region and the N-Well region are lightly doped, and the source region and the drain region are heavily doped.

In another aspect, the gate stack can be disposed over the P-well and partially over the N-well. The proposed device can further include a channel region that is configured between the source region and the drain region, and wherein the carriers drift from the source region to the channel region.

In an aspect, the proposed DeTFET device includes a drain region, a source region, and a channel region that is disposed between the source and the drain regions. The proposed DeTFET device further comprises a gate stack over the three regions. In an aspect, the source side region of the proposed device comprises P+ SiGe source with an N-type Si Epitaxial (Epi) region (or layer)(also interchangeably referred to as N-Epi layer) sandwiched between SiGe source and the gate stack to enable vertical or area tunneling of minority carriers from SiGe P+ source into N-Epi region under the influence of gate field.

In an aspect, the proposed DeTFET device comprises a P-Well region of first conductivity type, and a N-well region of second conductivity type next to each to form a junction that is disposed vertically over a substrate. The DeTFET device further includes a source region of the first conductivity type that is partially disposed inside the P-Well, and a drain region of the second conductivity type that is partially disposed inside the N-Well, wherein the device further comprises an epitaxial layer of the second conductivity type. The proposed DeTFET device further comprises a gate stack that is disposed over the epitaxial layer, the P-well, and partially over the N-well.

In an aspect, the disclosed design concept can be implemented in a planer device as well as in a fin based device that can result in further increase in area of the tunneling or alternatively can help in scaling down the size without compromising the performance.

Figures 3A, 3B:
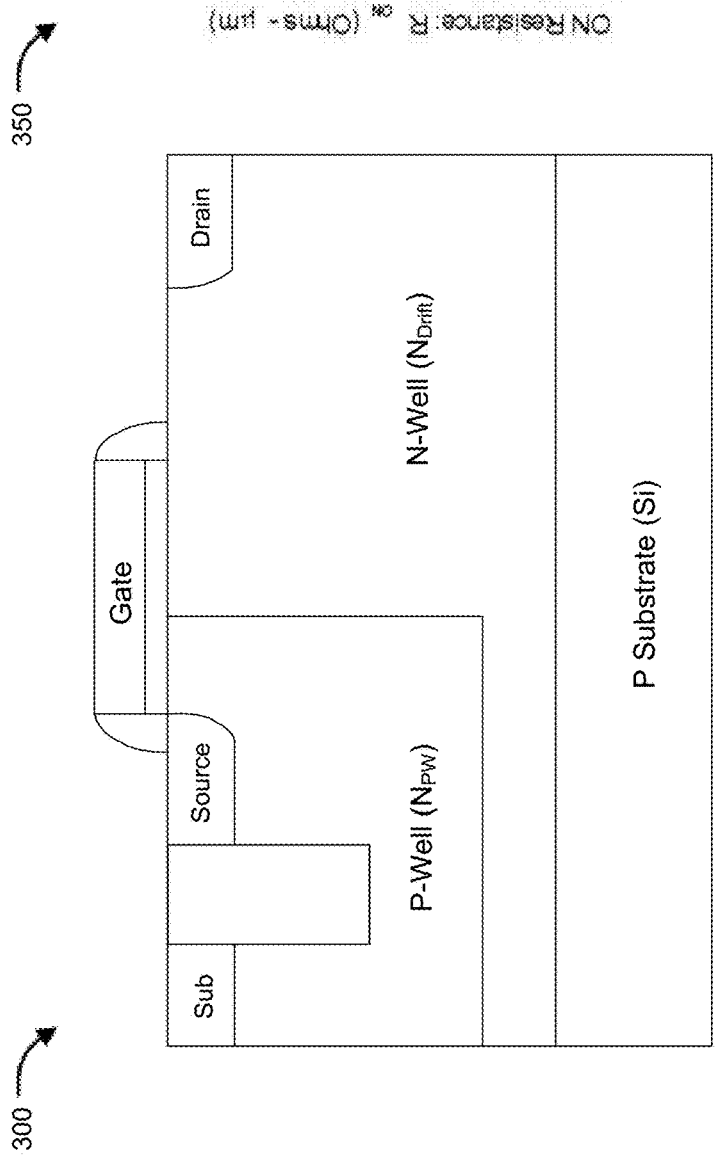
FIGS. 3A and 3B illustrate schematic view and RON vs. VBD trade-off of state of the art CMOS DeMOS device respectively.

In an aspect, one to one comparison of the proposed device has been done (subsequently) between the proposed invention (DeTFET) and the existing DeMOS device (which is a non-STI DeMOS device). FIGS. 3A and 3B illustrate schematic views of existing DeMOS device 300, and $R_{ON}$ (ON resistance) vs. $V_{BD}$(Breakdown Voltage) trade-off for the existing DeMOS device 300.

FIG. 4A illustrates a schematic view of a planer Drain extended Tunnel FET device 400 in accordance with embodiments of the present disclosure. In an aspect, the proposed device can include a drain side region (right of 'C-C'), a source side region (left of 'B-B'), and a channel region (between 'B-B' & 'C-C'). The proposed device 400 can incorporate a P-well region 412 of first conductivity type, and a N-well region 414 of second conductivity type. The device 400 can further include a source region 404 (such as P+ SiGe source region 404) of the first conductivity type disposed partially in the P-well region 412, and a drain region 408 of the second conductivity type disposed partially in the N-well. The proposed device 400 can further include an epitaxial layer 402 (such as N-type Si Epitaxial (Epi) region/layer 402) of the second conductivity type that is sandwiched between the source region 404 and a gate stack 406, wherein the epitaxial layer 402 partially covers the source 404, and the gate stack 406 completely covers the epitaxial region 402.

In an aspect, the N-type Si Epi region 402 sandwiched between SiGe source 404 and the gate stack 406 can enable vertical or area tunneling of minority carriers from SiGe P+ source 404 into N-Epi region 402 under the influence of gate field. The mobile carriers after tunneling from source 404 to the epitaxial region 402 are drifted from epitaxial region 402 to the N-Well 414. In an aspect, the area tunneling between the SiGe source 404 and the N-type Si Epi region 402 breaks the barrier imposed by thermionic injection based carrier transport from source to channel (which exists in DeMOS devices known in the art).

In an embodiment, the FET device 400 can include a substrate 410, wherein the P-Well 412 and the N-Well 414 are lightly doped and configured next to each other to forming a junction that is disposed vertically over the substrate 410. The source region 404 (also interchangeably referred to as source) can be a heavily doped first conductivity type region that is partially disposed inside the P-Well 412, and the drain region 408 (also interchangeably referred to as drain) can be a heavily doped second conductivity type region that is partially disposed inside the N-Well 414. In an aspect, the epitaxial layer 402 can be of second conductivity type, and can be partially disposed over the source region 404. The gate 406 can be a stack of dielectric and metal disposed over the epitaxial layer 402, the P-Well 412.

Alternatively, and to make a complimentary device, region 412 can be a lightly doped second conductivity type region (N-Well), region 414 can be a lightly doped first conductivity type region (P-Well), The source 404 can be a heavily doped second conductivity type region partially disposed inside the region 412, and the drain 408 can be a heavily doped first conductivity type region partially disposed inside the region 414. The epitaxial layer 402 can be of first conductivity type, and can be partially disposed over the source 404.

In an embodiment, the FET device 400 can further include shallow trench isolation (STI) inside the N-Well region 414, which can extend from the drain edge to partially under the gate stack 406. In an embodiment, the FET device 400 can have a channel region (B-B' to C-C') formed between the epitaxial layer 402 and the N-Well 414 under the gate stack 406. In another embodiment, the FET device 400 can further include a shallow island of first conductivity type inside the N-Well 414, wherein the shallow island can be configured between the drain edge and the gate stack 406.

In an embodiment, the epitaxial layer 402 can extend from the edge of the N-Well region 414 to partially cover the source 404. Further, there can be a dielectric or semiconducting tunnel barrier inserted between the source 404 and the epitaxial layer 402. The gate stack 406 can partially cover the epitaxial layer 402, wherein portion of the epitaxial layer 402 that remains outside the gate 406 can get consumed by Silicidation.

In an embodiment, the substrate 410 can be either or a combination of a semiconductor and an insulator material, and the N-Well region 414 and the P-Well region 412 can be of any or a combination of materials selected from Si, SiGe, Ge, materials belonging to III-V group or III-Nitride groups. The epitaxial layer 402 can be any one or a combination of materials selected out of Si, SiGe, Ge, materials belonging to III-V or III-Nitride groups, transition metal dichalcogenides, or other 2-Dimensional semiconductors.

In an embodiment, source 404 and epitaxial layer 402 can form a hetro-junction.

FIG. 4B illustrates valance band energies vs. distance along the section 'A-A' of FIG. 4A under ON and OFF states of the disclosed DeTFET device 400 and shows the principle of tunneling between the SiGe source 404 and the N-Epi region 402, which breaks the barrier imposed by thermionic injection based carrier transport from source to channel in case of DeMOS devices. Under OFF state, conduction band of the N-Epi region 402 is not aligned with the valance band of the SiGe P+ source 404, restricting quantum mechanical tunneling from valance to conduction band. However, the alignment is clearly evident under the influence of gate field (ON state), which enables the vertical tunneling. In an aspect, the source 404 can have a lower bandgap than epitaxial region 402. N-Well 414 region can have a higher bandgap than epitaxial region 402 and P-Well 412.

Figure 5:
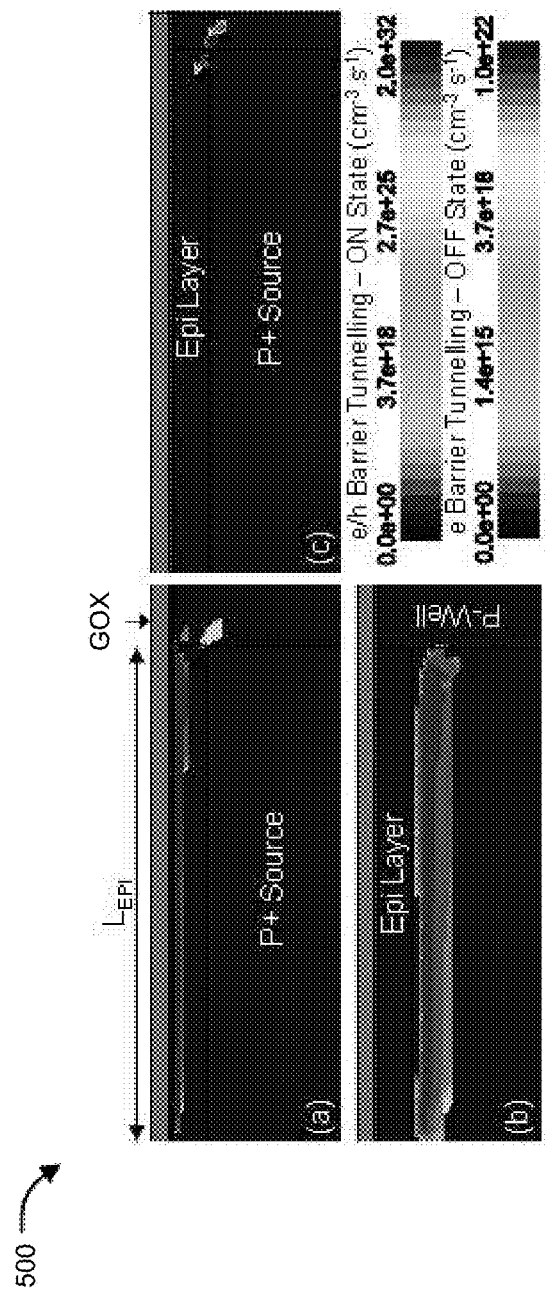
FIG. 5 illustrates e-barrier tunneling rate and h-barrier tunneling rate around SiGe source and Si Epi region in ON OFF state of the disclosed DeTFET device in accordance with embodiments of the present disclosure.

FIG. 5 illustrates e-barrier tunneling rate and h-barrier tunneling rate around SiGe source 404 and Si Epi region 402 in ON and OFF states of the disclosed DeTFET device 400. As can be seen from FIG. 5, barrier tunneling rate under ON state is over 10 orders of magnitude higher than the same under OFF state. Moreover, the BTBT under ON state takes places across the entire N-Epi region 402, sandwiched between SiGe source 404 and gate 406; unlike point tunneling under OFF state condition. Tunneling nature of carrier injection, from source to channel, along with (i) over 10 orders of magnitude difference between barrier tunneling rate under ON & OFF state and (ii) shift from point tunneling (OFF state) to area tunneling (ON state) leads to an excellent ON to OFF current ratio with steep sub-threshold slope (ss)/early turn-on as is apparent from FIG. 6.

Figure 6:
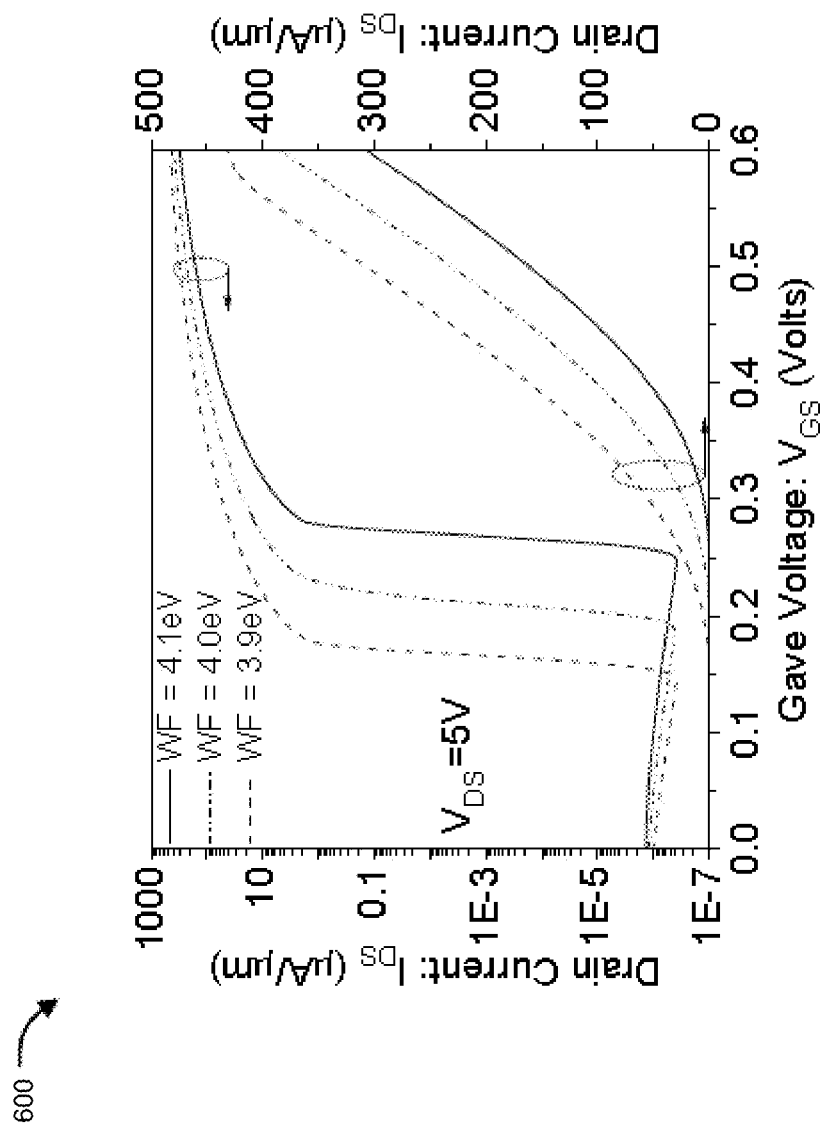
FIG. 6 illustrates drain current vs. gate voltage (ID-VG) characteristics of the disclosed DeTFET device as a function of gate metal work function (WF) in accordance with embodiments of the present disclosure.

FIG. 6 illustrates drain current vs. gate voltage (ID-VG) characteristics of the disclosed DeTFET device 400 as a function of gate metal work function (WF). For work function of 3.9 eV, proposed device is predicted to have OFF current ($I_{OFF}$) less than 1 pA/μm, threshold voltage (VT) =0.15V, sub-threshold slope less than 5 mV/decade and ON current exceeding 300 mA/μm at VGS=0.5V.

FIGS. 7A-7D illustrate exemplary comparison of $I_D$-$V_D$ and $I_D$-$V_G$ characteristics of DeTFET 400 and DeMOS device 300. With respect to the FIGS. 7A-7D, it can be seen that the ON current and OFF current of the proposed device are over 2 times higher and 8 times lower respectively than DeMOS device 300. It can further be seen that even for lower OFF current, the proposed DeTFET 400 has much smaller threshold voltage (0.15V) and significantly lower average SS (4 mV/dec, extracted over 6 orders of current) when compared to DeMOS device 300 (0.35V and 65 mV/dec, respectively), which is attributed to tunneling nature of carrier injection from source to channel. It can further be seen that DeTFET device 400 does not show threshold voltage shift as a function of drain voltage, unlike small shift present in DeMOS device 300 characteristics, which reveals absence of drain induced barrier lowering (DIBL) in DeTFET device 400, unlike DeMOS 300. This can help scaling the channel length further. It can further be seen that output characteristics of DeTFET 400 in the saturation region is almost flat unlike DeMOS device 300, which shows absence of channel length modulation in the proposed device. This is attributed to tunneling nature of current injection, which makes the carrier injection from source to drain almost independent of drain field. It can further be seen that higher output current swing in DeTFET 400 for smaller range of input/gate voltage, compared to DeMOS device 300.

Figures 8A, 8B, 8C, 8D:
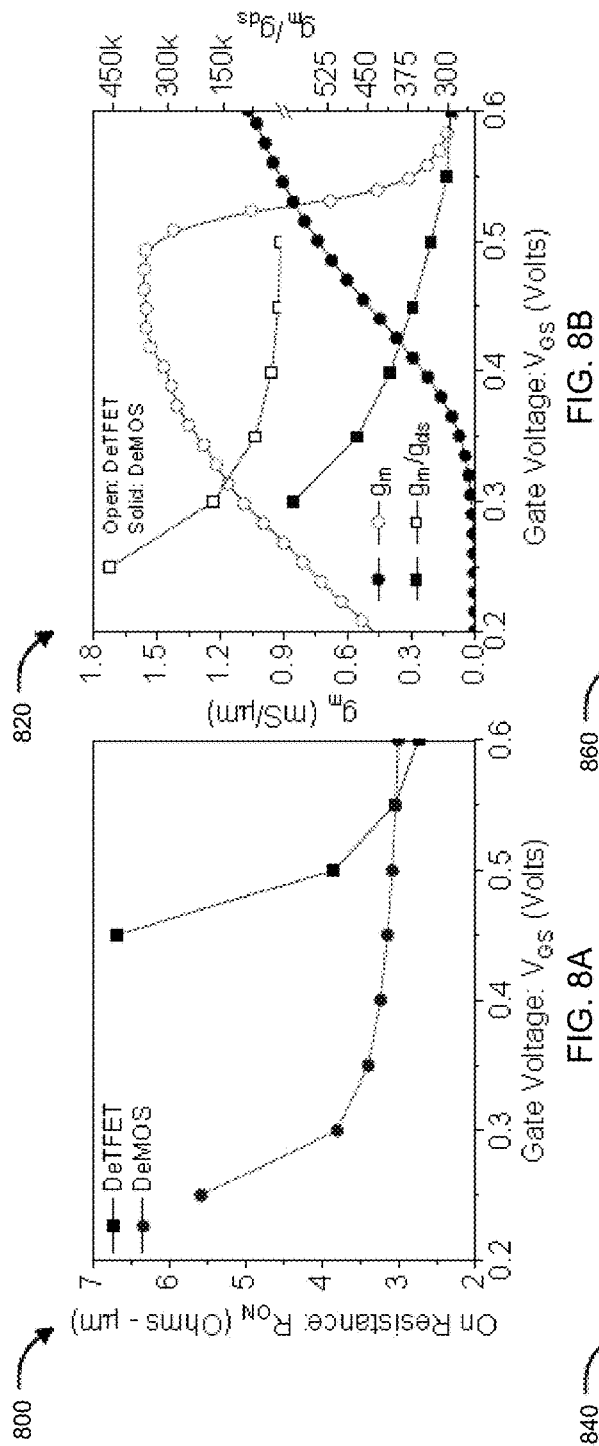
FIGS. 8A-8D illustrate comparison of switching, analog and RF figure of merit (FOM) parameters of the disclosed DeTFET device vis a vis state of art DeMOS device in accordance with embodiments of the present disclosure.

The differences and advantages presented above attributes to significantly reduced ON resistance of DeTFET device 400, for a wide range of gate voltage, compared to DeMOS device 300 as shown in FIG. 8A. Furthermore, DeTFET device 400 offers 1.5 times higher trans-conductance and orders of magnitude higher intrinsic transistor gain compared to DeMOS device 300 as shown in FIG. 8B.

FIG. 8C and FIG. 8D show that the DeTFET device 400 offers better cut-off frequency ($F_t$), maximum oscillation frequency ($F_{max}$) and RF power gain; however the peak with respect to gate voltage occurs at much lower gate voltages. This implies that at a given frequency and for a given output RF power level, required input power for DeTFET based RF power amplifier (PA) would be significantly lower compared to the same designed using DeMOS device 300. Hence, one can expect proposed DeTFET 400 based RF power amplifier (PA) to offer higher power added efficiency compared to DeMOS 300 based RF PA.

According to one embodiment, source drain region can have a doping in the range of 1e19 $cm^{-3}$-1e22 $cm^{-3}$. Similarly, N-Well/P-Well regions can have a doping in the range of 1e14 $cm^{-3}$-1e19 $cm^{-3}$. In another aspect, the gate stack can include a dielectric and metal (or poly silicon/metal+polysilicon) stack.

Figure 9:
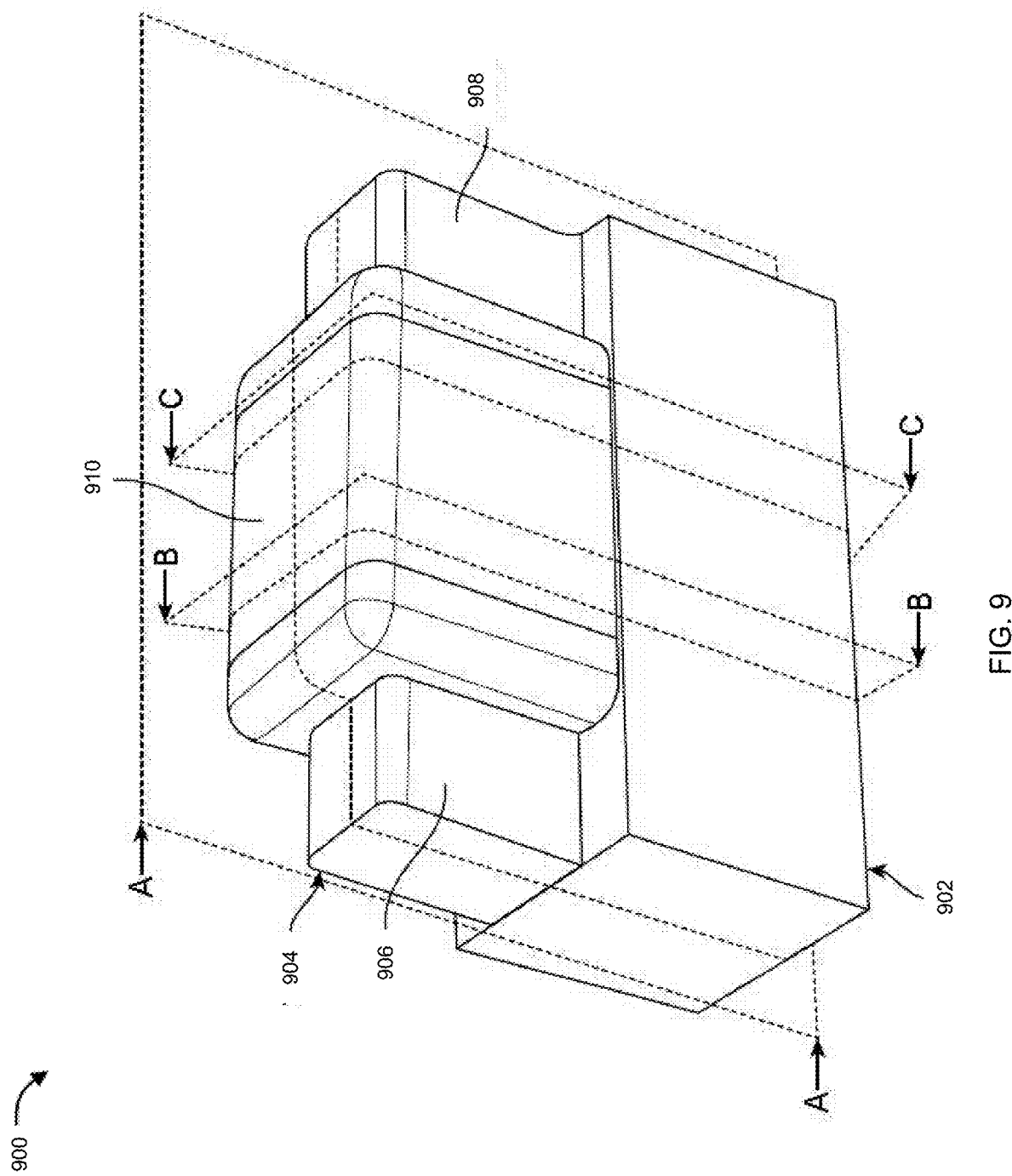
FIG. 9 illustrates an exemplary isometric representation of the disclosed design concept implemented in fin based device in accordance with embodiments of the present disclosure.

FIG. 9 illustrates an exemplary implementation of the disclosed design concept in a fin based DeTFET device 900 that can enhance the performance as the fin structure can result in further increase in the area of the tunneling or alternatively can help in scaling down the size without compromising the performance. Depicted therein is an isometric view of the disclosed device 900. The device 900 can include a three dimensional nano sized structure configured over a Buried Oxide (BOX) 902. In an embodiment, the three-dimensional nano sized structure can be fin 904 as depicted in the exemplary illustration in FIG. 9. It is to be understood that though the present disclosure have been explained with reference to a fin shaped structure, the three dimensional nano sized structure can be of any other suitable shape such as a nano wire and all such variations are well within the scope of the present disclosure.

In an embodiment, fin structure 904 can include a source 906 and a drain 908 at its two ends. Further there can be a gate stack 910 over the fin 904. In an embodiment, the device 900 can include an N-type Si Epitaxial region (not shown here) sandwiched between SiGe source 906 and gate stack 910. The N-type Si Epitaxial region sandwiched between the SiGe source 906 and the gate stack 910 can enable vertical or area tunneling of minority carriers from SiGe P+ source 906 into the N-Epi region under the influence of gate field.

Further details of the device 900 are shown in FIGS. 10A to 10C, which show the sectional view of the device 900 along sectional planes A-A, B-B, and C-C (FIG. 9) respectively.

FIG. 10A shows the sectional details along vertical plane A-A of FIG. 9. Depicted therein is that the fin structure 904 can include a substrate 1002, a lightly doped first conductivity type region (P-Well) 1004 and a second conductivity type region (N-Well) 1006—next to each other and forming junctions—disposed vertically over the substrate 1002. The source 906 can be a heavily doped first conductivity type region disposed above the P-Well 906 and the drain 908 can be a heavily doped second conductivity type region disposed over the N-Well 1006. The part (1008) of the fin 904 between the source 906 and the drain 908 can be of first conductivity type and can function as channel 1008. The epitaxial layer 1010 can be of second conductivity type, partially disposed over and wrapping around the source 906. The epitaxial layer 1010 can extend from the junction between the source 906 and channel 1008 to edge of the gate 910 in the source region. As shown, the epitaxial layer 1010 can be fully covered by the gate 910 sandwiched between the source 906 and the gate 910. Any extra length of the epitaxial layer 1010 that is not covered by the gate 910 can get consumed by Silicidation. The gate 910 can be a stack of dielectric and metal.

Alternatively and to make a complimentary device, the source 906 can be of second conductivity type (N+) and drain 908 of first conductivity type (P+) with a lightly doped epitaxial layer 1010 that can be first conductivity type (P+) partially overlapping the source 906. Further, the channel 1008 between the source and the drain can be lightly doped first or second conductivity type (N or P). Likewise, region 1004 can be a lightly doped second conductivity type region (N-Well), region 1106 can be a lightly doped first conductivity type region (P-Well), FIG. 10B illustrates sectional details of the device 900 along sectional planes B-B (FIGS. 9 and 10A) in the source region. As shown, the epitaxial layer 1010 sandwiched between the source 906 and the gate 910, wraps around the source 906. As is apparent, vertical tunneling can take place throughout the circumferential area of the fin 904 thus enhancing the performance and/or enabling scaling down of the device.

FIG. 10C illustrates sectional details of the device 900 along sectional planes C-C (FIGS. 9 and 10A) in the channel region. As shown, the gate 910 is stacked directly over the channel 1008.

While the foregoing describes various embodiments of the invention, other and further embodiments of the invention may be devised without departing from the basic scope thereof. The scope of the invention is determined by the claims that follow. The invention is not limited to the described embodiments, versions or examples, which are included to enable a person having ordinary skill in the art to make and use the invention when combined with information and knowledge available to the person having ordinary skill in the art.

Advantages of the Invention

The present disclosure provides a high power/high Voltage device concept for 5V to 20V operations in System on Chip (SoC) designs.

The present disclosure provides a drain extended high voltage/high power device design for tunnel FET technologies.

The present disclosure provides a device design that incorporates vertical (area scaled) band-to-band tunneling of carriers from source to channel unlike thermionic injection of carriers in the prior art devices.

The present disclosure provides device design that has higher ON current, lower OFF current (leakage), lower threshold voltage, steep sub-threshold slope, higher break down voltage with lower ON resistance and improved RF characteristics.

The present disclosure provides a device that has better scalability compared to state of art devices.

We Claim:

1. A field effect transistor device comprising:
   a source region of first conductivity type and a drain region of second conductivity type;
   an epitaxial layer of the second conductivity type that is partially disposed over the source region; and
   a gate stack that is disposed over the epitaxial layer, wherein gate field enables vertical tunneling of carriers from the source region to the epitaxial layer, and
   wherein the device further comprises a P-Well region of the first conductivity type and a N-well region of the second conductivity type configured next to each other to form a junction over a substrate.

2. The field effect transistor device of claim 1, wherein the source region is partially disposed inside the P-Well region, and the drain region is partially disposed inside the N-Well region.

3. The field effect transistor device of claim 1, wherein the P-Well region and the N-Well region are lightly doped, and wherein the source region and the drain region are heavily doped.

4. The field effect transistor device of claim 1, wherein the gate stack is disposed over the P-well and partially over the N-well.

5. The field effect transistor device of claim 1, wherein the device further comprises a channel region between the source region and the drain region, and wherein the carriers drift from the source region to the channel region.

6. The device of claim 1, wherein the device further comprises a Shallow Trench Isolation (STI) inside the N-Well, and wherein the STI extends from edge of the drain region to partially under the gate stack.

7. The device of claim 1, wherein the device further comprises a shallow island of first conductivity type inside the N-Well positioned between edge of the drain region and the gate stack.

8. The device of claim 1, wherein the epitaxial layer extends from the edge of the N-Well to partially cover the source.

9. The device of claim 1, wherein the gate stack covers the epitaxial layer partially, and wherein portion of the epitaxial layer that is outside the gate stack is consumed by Silicidation.

10. The device of claim 1, wherein the substrate is any or a combination of a semiconductor or an insulator.

11. The device of claim 1, wherein the N-Well region or the P-Well region is made of any or a combination of Si, SiGe, Ge, materials belonging to III-V or III-Nitride groups.

12. The device of claim 1, wherein the epitaxial layer is made of any or a combination of Si, SiGe, Ge, materials belonging to III-V or III-Nitride groups, transition metal dichalcogenides or other 2-Dimensional semiconductors.

13. The device of claim 1, wherein the source region has a lower bandgap than the epitaxial layer.

14. The device of claim 1, wherein the N-Well region has a higher bandgap than the epitaxial layer and the P-Well region.

15. The device of claim 1, wherein the source region and the epitaxial layer form a hetro-junction.

16. The device of claim 1, wherein a dielectric or semiconducting tunnel barrier is inserted between the source region and the epitaxial layer.

17. A field effect transistor device that is complimentary to the device of claim 1.

18. An integrated circuit comprising any or a combination of the field effect transistor device of claim 1.

* * * * *